(12) United States Patent
Tsai et al.

(10) Patent No.: US 10,358,339 B2
(45) Date of Patent: *Jul. 23, 2019

(54) MICRO-ELECTRO-MECHANICAL DEVICE HAVING LOW THERMAL EXPANSION DIFFERENCE

(71) Applicant: PixArt Imaging Incorporation, Hsin-Chu (TW)

(72) Inventors: Ming-Han Tsai, Hsin-Chu (TW); Yu-Chia Liu, Hsin-Chu (TW); Wei-Leun Fang, Hsin-Chu (TW)

(73) Assignee: PIXART IMAGING INCORPORATION, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/913,654

(22) Filed: Mar. 6, 2018

(65) Prior Publication Data

US 2018/0201499 A1 Jul. 19, 2018

Related U.S. Application Data

(62) Division of application No. 14/061,698, filed on Oct. 23, 2013, now Pat. No. 9,944,513.

(30) Foreign Application Priority Data

Nov. 26, 2012 (TW) .............................. 101144092 A

(51) Int. Cl.
*B81B 3/00* (2006.01)

(52) U.S. Cl.
CPC .................................. *B81B 3/0081* (2013.01)

(58) Field of Classification Search
CPC ...................................................... B81B 3/0081
USPC ....................................................... 73/514.32
See application file for complete search history.

(56) References Cited

U.S. PATENT DOCUMENTS

| 5,719,336 A * | 2/1998 | Ando | G01P 15/125 73/514.32 |
| 8,877,536 B1 * | 11/2014 | Quevy | B81B 3/0072 438/50 |
| 2010/0242606 A1 * | 9/2010 | Kanemoto | G01P 15/0802 73/514.38 |
| 2010/0258950 A1 * | 10/2010 | Li | B81C 1/00269 257/777 |
| 2013/0139595 A1 * | 6/2013 | Tsai | G01P 15/125 73/514.32 |

* cited by examiner

*Primary Examiner* — Tarun Sinha
(74) *Attorney, Agent, or Firm* — Tung & Associates

(57) ABSTRACT

The invention provides a micro-electro-mechanical device which is manufactured by a CMOS manufacturing process. The micro-electro-mechanical device includes a stationary unit, a movable unit, and a connecting member. The stationary unit includes a first capacitive sensing region and a fixed structure region. The movable unit includes a second capacitive sensing region and a proof mass, wherein the first capacitive sensing region and the second capacitive sensing region form a capacitor, and the proof mass region consists of a single material. The connecting member is for connecting the movable unit in a way to allow a relative movement of the movable unit with respect to the stationary unit.

6 Claims, 4 Drawing Sheets

MICRO-ELECTRO-MECHANICAL DEVICE HAVING LOW THERMAL EXPANSION DIFFERENCE

CROSS REFERENCE

The present invention claims priority to TW 101144092, filed on Nov. 26, 2012.

This is a Divisional of a co-pending application Ser. No. 14/061,698, filed on Oct. 23, 2013.

BACKGROUND OF THE INVENTION

Field of Invention

The present invention relates to a micro-electro-mechanical device, especially a micro-electro-mechanical device having a larger single material stacking structure which is more resistive to warpage due to temperature difference, to improve sensing performance.

Description of Related Art

FIG. 1 shows an acceleration sensor 10, which is an example of a micro-electro-mechanical device. Recently micro-electro-mechanical devices are often manufactured by a CMOS manufacturing process, and the structure of the micro-electro-mechanical device is formed by stacking oxide layers and metal layers in the CMOS manufacturing process. The CMOS manufacturing process makes it easier to manufacture the micro-electro-mechanical device due to its low production cost, ample material supply, and standardized manufacturing steps. FIG. 2 is a cross section view according to the cross section line AA' in FIG. 1, which shows that the acceleration sensor 10 has a structure of alternatingly deposited oxide and metal layers.

However, the micro-electro-mechanical device needs to face significant temperature variations either in its manufacturing process (e.g., deposition, sputtering, baking, annealing, etc.) or its operation environment. The micro-electro-mechanical device typically includes materials such as aluminum, silicon dioxide and tungsten, which have different thermal expansion coefficients. Aluminum has a thermal expansion coefficient of about $2*10^{-5}$ $1/^\circ$ C.; silicon dioxide has a thermal expansion coefficient of about $5*10^{-7}$ $1/^\circ$ C.; and tungsten has a thermal expansion coefficient of about $5*10^{-6}$ $1/^\circ$ C. Because of the very different thermal expansion coefficients (the thermal expansion coefficient of aluminum is about fifty times of the thermal expansion coefficient of silicon dioxide), serious warpage often occurs at the interface between these different materials when the micro-electro-mechanical device experiences temperature variations.

FIG. 3 is a cross section view taken along the cross section line aa' of FIG. 1 (but the width is not drawn according to scale), which shows the metal layers (mainly consisting of aluminum), oxide layers (mainly consisting of silicon dioxide), and via layers (mainly consisting of tungsten) in a prior art micro-electro-mechanical device. There are many interfaces between aluminum, silicon dioxide, and tungsten which are distributed widely over the micro-electro-mechanical device, so serious warpage occurs when the device experiences temperature variations. Moreover, in order to increase the sensitivity of the acceleration sensor, more stacking layers are often added to the movable unit of the acceleration sensor, and this even more worsen the warpage problem. The warpage may be as large as 10 μm in a typical operation environment. The warpage problem may also result in a dimensional change of a critical part of the device to cause signal distortion. One solution to this problem is a sandwich structure consisting of metal and oxide layers, which can reduce the warpage to some extent, but this requires a more precise manufacturing process, such as precise thickness control; if such precise control can not be achieved, the warpage problem is still unsolved. When there are temperature variations, the prior art micro-electro-mechanical device suffers problems of structure reliability and signal distortions, which degrades the performance of the device.

U.S. Pat. No. 7,258,012 discloses a method which makes use of the silicon substrate below the device structure to reinforce the structure strength against heat distortion, but its manufacturing process is very complicated and difficult to implement.

In view of the above, it is important to solve the problem of the warpage of the micro-electro-mechanical device due to temperature variations.

SUMMARY OF THE INVENTION

In one aspect of the present invention, a micro-electro-mechanical device having low thermal expansion difference is disclosed and the micro-electro-mechanical device is manufactured by a CMOS manufacturing process. The micro-electro-mechanical device includes: a stationary unit, including a first capacitive sensing region and a fixed structure region; a movable unit, including a second capacitive sensing region and a proof mass, wherein the first capacitive sensing region and the second capacitive sensing region form a capacitor, and the proof mass consists of a single material; and a connecting member for connecting the movable unit while allowing a relative movement of the movable unit with respect to the stationary unit.

In another aspect, the present invention provides a micro-electro-mechanical device having low thermal expansion difference, which is manufactured by a CMOS manufacturing process. The micro-electro-mechanical device includes: a stationary unit, including a first capacitive sensing region and a fixed structure region; a movable unit, including a second capacitive sensing region, wherein the first capacitive sensing region and the second capacitive sensing region form a capacitor, and from top view, more than 50% of the total area of the movable unit is formed by a single material from top surface through bottom surface; and a connecting member, connecting the movable unit while allowing a relative movement of the movable unit with respect to the stationary unit.

In one embodiment of the present invention, the proof mass includes plural through holes.

In one embodiment of the present invention, the single material can be an insulating material such as silicon dioxide.

In one embodiment of the present invention, the fixed structure region consists of a single material.

In one embodiment of the present invention, from top view, more than 50% of the total area of the stationary unit is formed by the single material from top surface through bottom surface.

In one embodiment of the present invention, the stationary unit includes plural through holes.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustrative purpose only, but not drawn according to actual scale. The orientation wordings in the description such as: above, under, left, or right are for reference with respect to the drawings, but not for limiting the actual product made according to the present invention.

Figure 4:
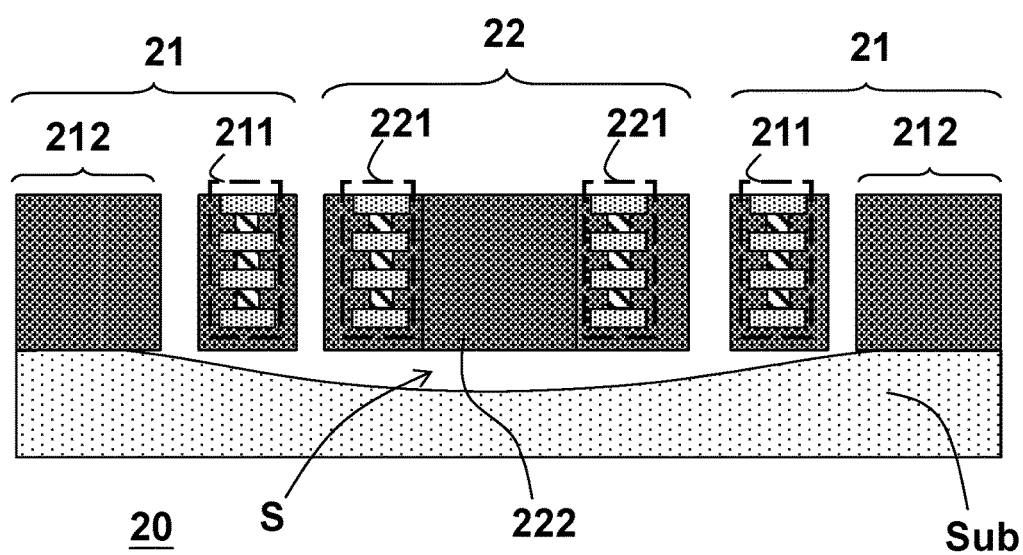
FIG. 4 shows a cross section view of a preferable embodiment of the micro-electro-mechanical device according to the present invention, wherein the cross section view is corresponding to the cross section line bb' show in FIG. 5.
Figure 5:
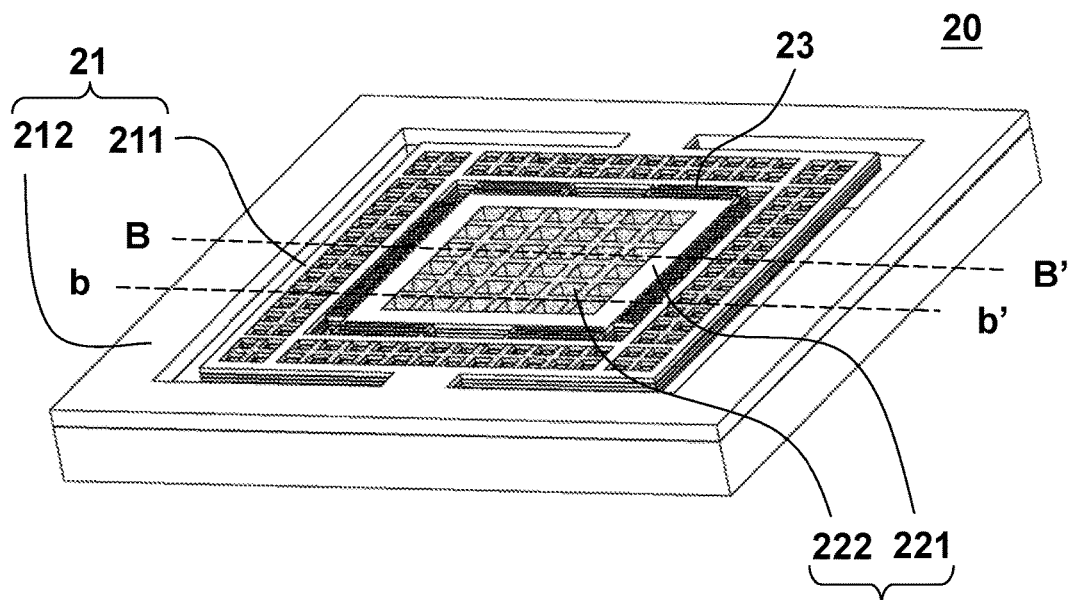
FIG. 5 shows a 3D view of a preferable embodiment of the micro-electro-mechanical device according to the present invention.
Figure 7:
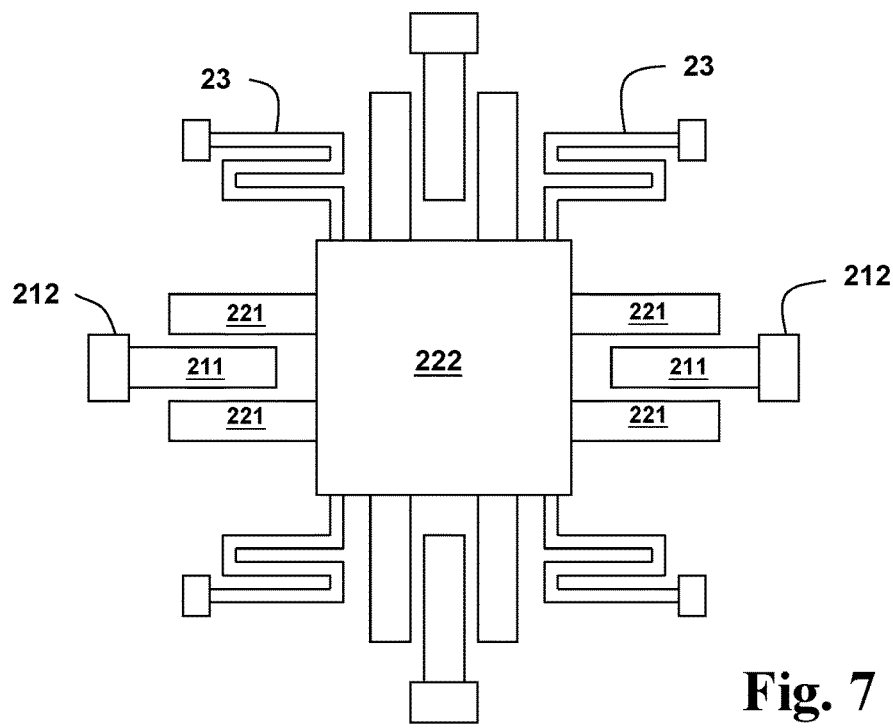
FIG. 7 shows another layout embodiment of the micro-electro-mechanical device according to the present invention.

FIGS. 4 and 5 show a cross section view and a 3D view of an embodiment of the micro-electro-mechanical device 20 according to the present invention, respectively. The cross section of FIG. 4 is taken along the cross section line bb' of FIG. 5, but the width is not drawn according to scale. The micro-electro-mechanical device 20 is manufactured by a CMOS manufacturing process, and the micro-electro-mechanical device 20 includes a stationary unit 21, a movable unit 22, and a connecting member 23. The stationary unit 21 includes a capacitive sensing region 211 and a fixed structure region 212; the movable unit 22 includes a capacitive sensing region 221 and a proof mass 222, wherein the capacitive sensing region 211 of the stationary unit 21 and the capacitive sensing region 221 of the movable unit 22 form a capacitor, and the movement of the movable unit 22 can be sensed by reading the variations of the capacitance. The movable unit 22 shown in the figure has a square shape and the stationary unit 21 surrounds the movable unit 22, which is only an example of the layout. The stationary unit 21 and the movable unit 22 can be arranged by various layouts and have various shapes, as referring to U.S. Pat. No. 7,989,247 assigned to the same assignee of the present invention, which show several examples. Besides, the sensor is not limited to a 2D sensor; instead, it may be a 3D sensor, as referring to U.S. 2011/0162453 assigned to the same assignee of the present invention. As an example, FIG. 7 also illustrates another possible arrangement of the layout and shapes.

Referring to FIG. 5, the movable unit 22 can be connected to another portion of the micro-electro-mechanical device 20 by a connecting member 23. In this embodiment, the movable unit 22 is connected to the capacitive sensing region 211 of the stationary unit 21; however, the present invention is not limited to this embodiment, and the movable unit 22 can be connected to any other portion of the micro-electro-mechanical device 20 by the connecting member 23 (as referring to the aforementioned patent and publication assigned to the same assignee of the present invention). The connecting member 23 is preferred to be flexible so as to allow a relative movement between the movable unit 22 and the stationary unit 21 within a limited range, and the relative movement can be sensed by reading the variations of the capacitance.

Figure 1:
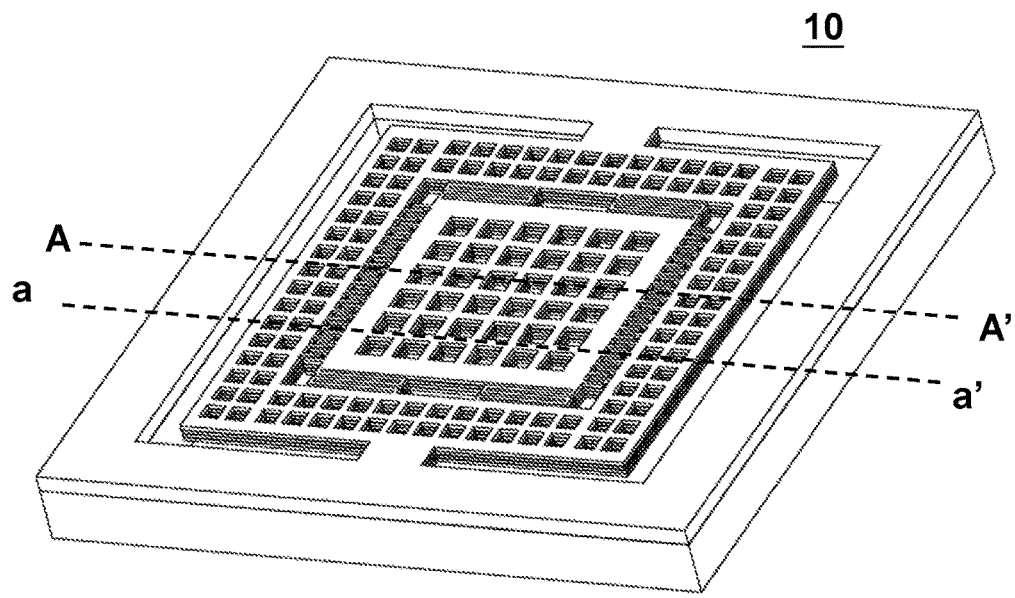
FIG. 1 shows a prior art micro-electro-mechanical device.
Figure 2:
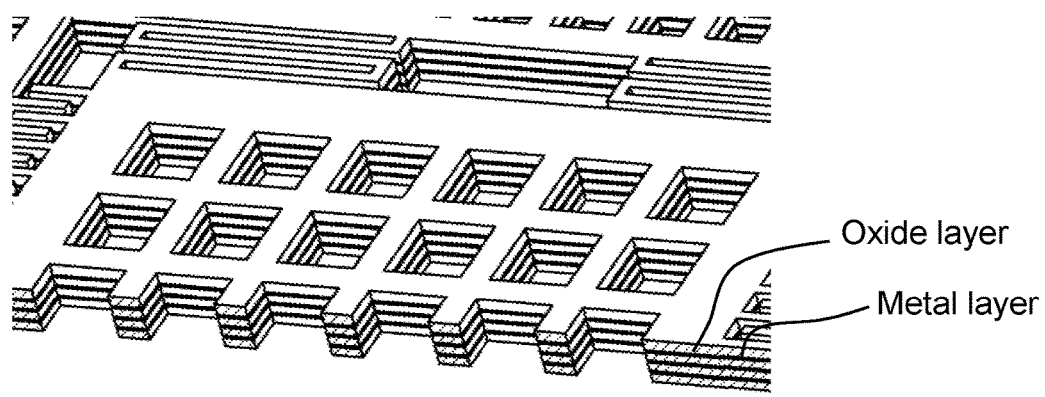
FIG. 2 shows a cross section view according the cross section line AA' shown in FIG. 1.
Figure 3:
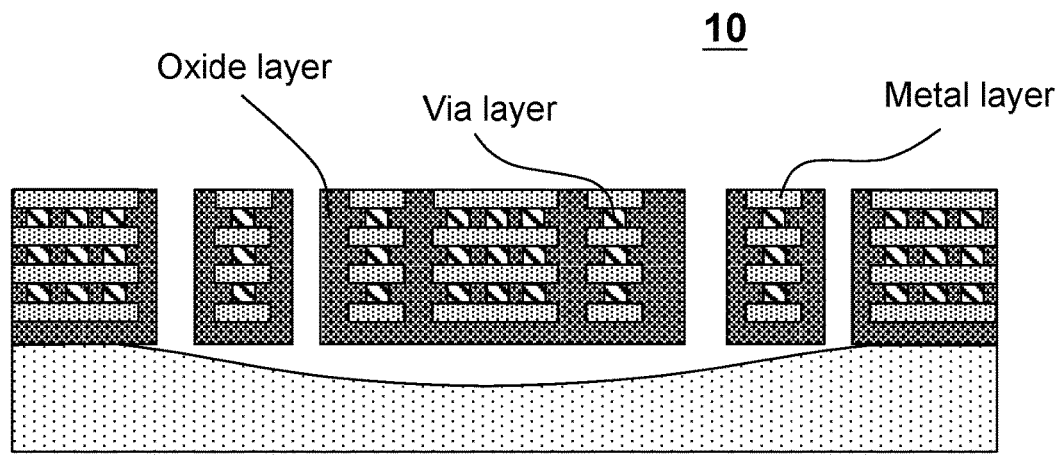
FIG. 3 shows a cross section view of the prior art micro-electro-mechanical device according the cross section line aa' shown in FIG. 1.

In the present invention, the proof mass 222 is made of a single material which may comprise multiple stacked layers. (The term "single material" does not mean that the single base material absolutely can not contain any other material such as impurities of a low percentage, but means that by industry standard the other material, if there is any, is insignificant that such other material does not substantially affect the property of the single base material, wherein the property is the thermal expansion coefficient as far as the present invention is concerned.) In this embodiment, the signal material is an oxide (such as silicon dioxide), but it can be any other conductive or insulating material used in forming interconnection in the CMOS manufacturing process. FIGS. 4 and 5 show an embodiment wherein the single material is an insulating material; an embodiment wherein the single material is a conductive material embodiment will be described later. The proof mass 222 formed by one single material is shown by one shaded block, but it may comprise multiple layers, and its location and size are not limited to what are shown in the figure. There can be more than one proof mass 222 and the number of the proof mass 222 can be determined depending on practical needs. Compared with FIG. 3, the proof mass 222 formed by one single material shown in FIGS. 4 and 5 replaces the traditional complicated sandwich structure consisting of metal layers, oxide layers and via layers, so the risk of warpage due to temperature change is greatly reduced, which is an important benefit of the present invention.

In the embodiment shown in FIGS. 4 and 5, the micro-electro-mechanical device 20 is shown to include only one proof mass 222 and the proof mass 222 is formed as a single region. The present invention is limited to this embodiment; the micro-electro-mechanical device 20 can include more than one proof mass 222, and the proof mass region 222 can be divided into several individual regions.

Figure 6:
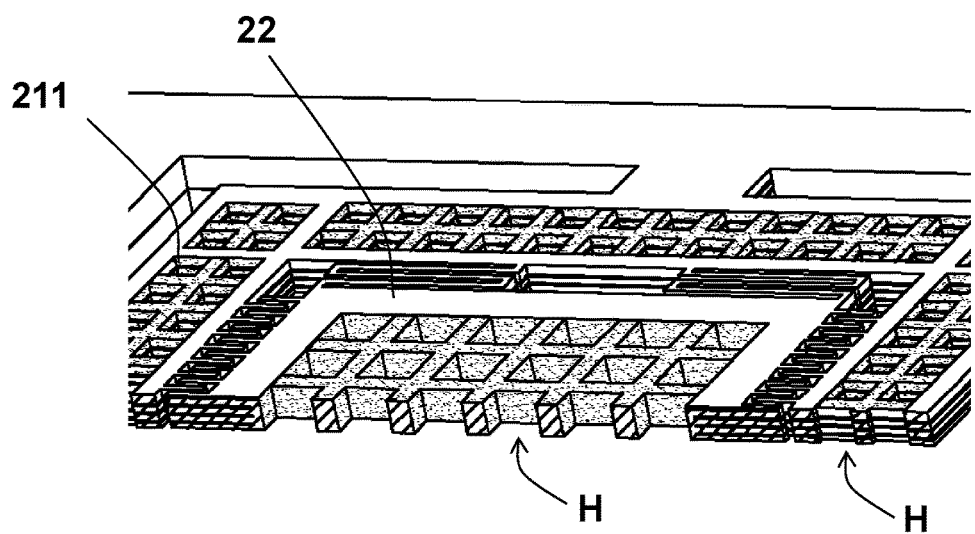
FIG. 6 shows a cross section view according to the cross section line BB' show in FIG. 5.

FIG. 6 shows a cross section view taken along the BB' cross section line of FIG. 5. FIG. 6 shows that, preferably, the stationary unit 21 and the movable unit 22 have plural through holes H. The through holes H allow the etchant to enter under the stationary unit 21 and/or the movable unit 22 during an etching step to form a spacing (S, FIG. 4) between the movable unit 22 and the substrate (sub, FIG. 4). The movable unit 22 becomes movable by this etching step. Besides, the plural through holes S also can reduce the residual stress in the micro-electro-mechanical device 20. FIG. 4 shows that the movable unit 22 becomes movable by etching the top surface of the substrate Sub, which is only an example and the present invention is not limited to this embodiment; the movable unit 22 can become movable by other ways such as by etching other portions of the micro-electro-mechanical device 20.

Because the micro-electro-mechanical device 20 can have various different shapes and layouts, and in some of the shapes and layouts, the proof mass 222 and the capacitive sensing region 211 may not be easily distinguished from one the other. Therefore, the present invention can be defined from another aspect as: from top view, more than 50% of the total area (including the area of the through holes if there are through holes) of the movable unit 22 is formed by one single material from top surface through bottom surface. When more than 50% of the total area is formed by one single material to replace the traditional sandwich structure consisting of metal layers, oxide layers and via layers, the risk of warpage due to temperature change can be greatly reduced.

Referring to FIG. 4, preferably, the stationary unit 21 can (but not necessarily) also be made of a single material, or, from top view, more than 50% of the total area (including the area of the through holes if there are through holes) of the stationary unit 21 is formed by one single material from top surface through bottom surface.

In the embodiment of FIG. 4, the bottom layers of the stationary unit 21 and the movable unit 22 are oxide layers, and the top layers of the stationary unit 21 and the movable unit 22 are metal layers, which is for illustrative purpose and not for limiting the present invention. For example, the bottom layer can be a metal layer or a poly-silicon layer; for another example, the top metal layer shown in FIG. 4 can be covered with an oxide layer.

Figure 8:
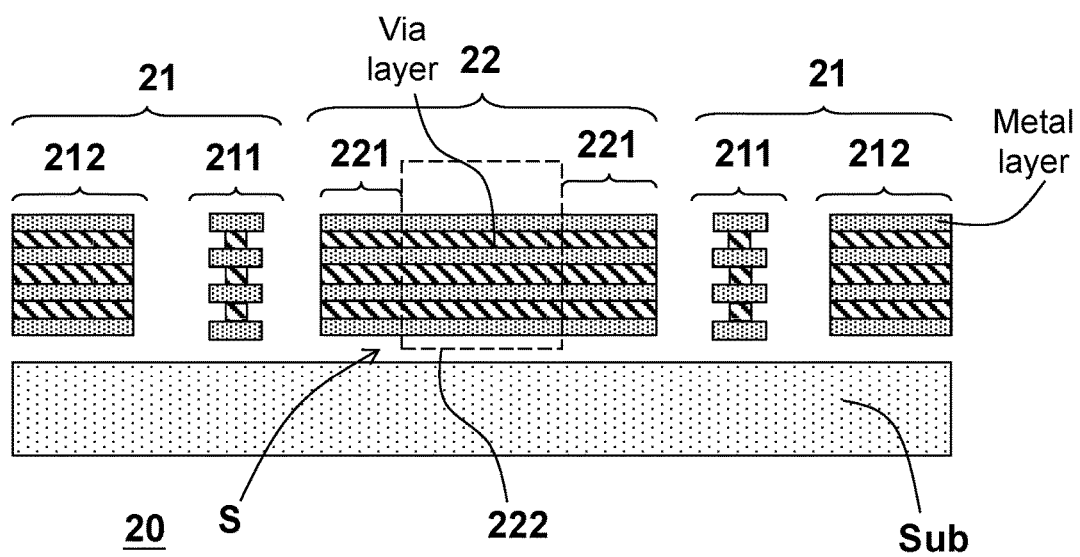
FIG. 8 shows across section view of another preferable embodiment of the micro-electro-mechanical device according to the present invention.

FIG. 8 shows another embodiment wherein the proof mass 222 of the micro-electro-mechanical device 20 is formed by multiple stacked layers of meal instead of oxide. The stacked layers include metal layers and via layers, and the materials of the metal layers and via layers can be the same or different. When the materials of the metal layers and via layers are different, there is a thermal expansion difference between the adjacent metal and via layers, but less than the difference between oxide and metal. Hence, if the warpage requirement is not stringent, the materials of the metal layers and via layers can be different. In practical implementation, the selection of the materials of the metal and via layers can be determined according to requirements. As shown in FIG. 8, the spacing S can be formed by etching another material layer instead of the top surface of the substrate Sub. And, the fixed structure region 212 can be (but not necessarily be) formed by a single material.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the type and application of the micro-electro-mechanical device and the motion style of the movable unit are not limited; the movable unit can be designed to sense acceleration, pressure, acoustic vibration, etc., and the relationship or capacitor between the movable unit and the stationary unit is not limited to be horizontal and can in another dimension (such as vertical), which should also be within the spirit of the present invention. For another example, a device which does not affect the primary function of the units can be inserted between two units shown to be in direct connection in the figures. Therefore, the scope of the present invention should cover all such modifications and variations. An embodiment or a claim of the present invention does not need to attain or include all the objectives, advantages or features described in the above. The abstract and the title are provided for assisting searches and not to be read as limitations to the scope of the present invention.

What is claimed is:

1. A micro-electro-mechanical device comprising:
a substrate;
a stationary unit connected to the substrate, the stationary unit including a first capacitive sensing region and a fixed structure region;
a movable unit above the substrate, the movable unit including a second capacitive sensing region, the movable unit having a thickness direction which is normal to a bottom surface of the substrate, and a lateral direction which is in parallel to the bottom surface of the substrate, wherein the first capacitive sensing region and the second capacitive sensing region form a capacitor, and more than 50% of the movable unit is formed by a single material which extends continuously from a top surface of the movable unit through a bottom surface of the movable unit in the thickness direction, wherein the single material includes multiple stacked metal layers; and
a connecting member, connecting the movable unit while allowing a relative movement of the movable unit with respect to the stationary unit.

2. The micro-electro-mechanical device of claim 1, wherein the movable unit includes a plurality of through holes, and the total area of the movable unit includes areas of the through holes.

3. The micro-electro-mechanical device of claim 1, wherein the single material is an insulating material.

4. The micro-electro-mechanical device of claim 2, wherein the single material consists of silicon dioxide.

5. The micro-electro-mechanical device of claim 1, wherein the fixed structure region consists of a single material.

6. The micro-electro-mechanical device of claim 5, wherein from top view, more than 50% of the total area of the stationary unit is formed by the single material from top surface through bottom surface.

* * * * *